US009120955B2

(12) United States Patent
Arimitsu (10) Patent No.: US 9,120,955 B2
(45) Date of Patent: Sep. 1, 2015

(54) DOUBLE-SIDED ADHESIVE TAPE OR SHEET, AND ADHEREND PROCESSING METHOD

(75) Inventor: Yukio Arimitsu, Osaka (JP)

(73) Assignee: NITTO DENKO CORPORATION, Osaka (JP)

(*) Notice: Subject to any disclaimer, the term of this patent is extended or adjusted under 35 U.S.C. 154(b) by 61 days.

(21) Appl. No.: 13/980,619

(22) PCT Filed: Jan. 17, 2012

(86) PCT No.: PCT/JP2012/050857
§ 371 (c)(1),
(2), (4) Date: Sep. 16, 2013

(87) PCT Pub. No.: WO2012/099122
PCT Pub. Date: Jul. 26, 2012

(65) Prior Publication Data
US 2014/0002953 A1 Jan. 2, 2014

(30) Foreign Application Priority Data

Jan. 19, 2011 (JP) ................................. 2011-009255

(51) Int. Cl.
*C09J 7/02* (2006.01)
*B32B 27/00* (2006.01)
(Continued)

(52) U.S. Cl.
CPC ............... *C09J 7/0207* (2013.01); *B32B 27/00* (2013.01); *B32B 27/38* (2013.01); *B32B 27/40* (2013.01);
(Continued)

(58) Field of Classification Search
CPC .............. C09J 5/06; C09J 5/08; C09J 7/0207; C09J 7/0296; C09J 7/02; C09J 2203/326; C09J 2205/11; H01L 21/68; H01L 21/683; H01L 21/6836; H01L 2221/68327; H01L 2924/19041
USPC ......................................... 156/89.12
See application file for complete search history.

(56) References Cited

U.S. PATENT DOCUMENTS

2008/0169062 A1* 7/2008 Kishimoto et al. ........... 156/280
2010/0119757 A1 5/2010 Shimokawa et al.
(Continued)

FOREIGN PATENT DOCUMENTS

CN 101235259 A 8/2008
GB 1308531 A 2/1973
(Continued)

OTHER PUBLICATIONS

Office Action dated Feb. 28, 2014, issued by the State Intellectual Property Office of the People's Republic of China in counterpart Chinese Application No. 201280006030.2.
(Continued)

*Primary Examiner* — Alex Efta
(74) *Attorney, Agent, or Firm* — Sughrue Mion, PLLC (57) ABSTRACT

The present invention relates to a double-sided pressure-sensitive adhesive tape or sheet, containing a heat-releasable pressure-sensitive adhesive layer containing a heat-expandable microsphere on one side of a substrate, and a pressure-sensitive adhesive layer for temporary fixing on another side of the substrate, in which the pressure-sensitive adhesive layer for temporary fixing has a tensile pressure-sensitive adhesive strength of 2.0 to 20 N/20 mm in width and an amount of displacement of 0.3 mm/20 mm in width or less, and the pressure-sensitive adhesive layer for temporary fixing is crosslinked with an isocyanate or epoxy crosslinking agent.

7 Claims, 2 Drawing Sheets

(51) Int. Cl.
  *B32B 27/38* (2006.01)
  *B32B 27/40* (2006.01)
  *C09J 201/00* (2006.01)
  *H01L 21/683* (2006.01)
  *H01G 4/30* (2006.01)
  *C09J 5/06* (2006.01)
  *C09J 5/08* (2006.01)
  *C08K 5/00* (2006.01)
  *C08K 9/10* (2006.01)

(52) U.S. Cl.
  CPC ............... *C09J 201/00* (2013.01); *H01G 4/30* (2013.01); *H01L 21/6836* (2013.01); *B32B 2405/00* (2013.01); *C08K 5/0025* (2013.01); *C08K 9/10* (2013.01); *C09J 5/06* (2013.01); *C09J 5/08* (2013.01); *C09J 7/02* (2013.01); *C09J 2201/134* (2013.01); *C09J 2201/622* (2013.01); *C09J 2203/326* (2013.01); *C09J 2205/102* (2013.01); *C09J 2205/11* (2013.01); *H01L 2221/6834* (2013.01); *H01L 2221/68327* (2013.01); *Y10T 156/10* (2015.01); *Y10T 428/287* (2015.01); *Y10T 428/2896* (2015.01)

(56) References Cited

U.S. PATENT DOCUMENTS

| | | | |
|---|---|---|---|
| 2010/0119816 A1* | 5/2010 | Shimokawa et al. | 428/324 |
| 2010/0215882 A1* | 8/2010 | Yanagi et al. | 428/41.3 |

FOREIGN PATENT DOCUMENTS

| | | |
|---|---|---|
| JP | 50-13878 Y | 4/1975 |
| JP | 51-024534 B | 7/1976 |
| JP | 56-61468 A | 5/1981 |
| JP | 56-61469 A | 5/1981 |
| JP | 60-252681 A | 12/1985 |
| JP | 2003-327936 A | 11/2003 |
| JP | 2004-123769 A | 4/2004 |
| JP | 2008-195927 A | 8/2008 |
| JP | 2008-214500 A | 9/2008 |
| WO | 2008133120 A1 | 11/2008 |

OTHER PUBLICATIONS

International Search Report (PCT/ISA/210) issued Mar. 6, 2012 in corresponding International Application No. PCT/JP2012/050857.

Written Opinion (PCT/ISA/237) issued Mar. 6, 2012 in corresponding International Application No. PCT/JP2012/050857.

Notification of Second Office Action dated Oct. 20, 2014, issued by the State Intellectual Property Office of P.R. China in counterpart Chinese Application No. 201280006030.2.

Notification of Reasons for Refusal dated Mar. 13, 2015 issued by the Japanese Patent Office in counterpart Japanese Patent Application No. 2011-009255.

* cited by examiner

DOUBLE-SIDED ADHESIVE TAPE OR SHEET, AND ADHEREND PROCESSING METHOD

TECHNICAL FIELD

The present invention relates to a double-sided pressure-sensitive adhesive tape or sheet and a method of processing an adherend. More specifically, it relates to a double-sided pressure-sensitive adhesive tape or sheet capable of effectively maintaining a state that an adherend is fixed to a pedestal even when a stress resulting from a warp is generated therein at the time of carrying out processing of the adherend in such a state that the tape or sheet is fixed to the pedestal through a pressure-sensitive adhesive layer for temporary fixing and the adhered is affixed on a heat-releasable pressure-sensitive adhesive layer, also capable of suppressing or preventing lateral displacement that may result from pressurization even when there is a pressurization step at the processing of the adherend, and capable of easily releasing the processed article by heating without damage after carrying out the processing of the adherend; and to a method of processing an adherend by using the double-sided pressure-sensitive adhesive tape or sheet.

BACKGROUND ART

A recent demand on electronic components is miniaturization and refinement of the components themselves. For example, in ceramic capacitors, miniaturization represented by the sizes such as so-called "0603" and "0402" and capacity increase resulting from a trend for high lamination exceeding several hundred layers become remarkable. Particularly, in a field of lamination of a ceramic sheet before firing (green sheet), such as a ceramic capacitor, accuracy at processing has been increasingly required with the progress of miniaturization and refinement.

For example, one example of process for fabricating a ceramic capacitor includes (1) step of printing electrodes on green sheets; (2) lamination step; (3) pressurization step (pressing step under pressure); (4) cutting step; and (5) firing step. Also, there may be mentioned a fabrication process wherein the lamination step (2) and the pressurization step (3) are repeated predetermined times and then the cutting step (4) follows.

Currently, in the lamination step (2), it is common to perform lamination on a polyethylene terephthalate film (PET film), a clean paper or a pressure-sensitive adhesive tape but, in view of transportability and accuracy improvement, there is a case where, using a metal-made pedestal, a PET film, a clean paper, or a pressure-sensitive adhesive tape is fixed thereon and then lamination is performed.

Moreover, the lamination step (2) and the cutting step (4) are different steps each other. A laminate laminated on a PET film, a clean paper, or a pressure-sensitive adhesive tape in the lamination step (2) is sometimes transferred to another pressure-sensitive adhesive tape or the like and cut in the cutting step (4). However, in this method, different members are used in the lamination step (2) and the cutting step (4).

Therefore, attention has been attracted to a method of performing lamination to cutting on a heat-releasable pressure-sensitive adhesive tape or sheet as an extremely effective method and there are actual results of practical application and production. As such pressure-sensitive adhesive tapes, there have been used heat-releasable pressure-sensitive adhesive tapes or sheets having functions capable of being securely pressure-sensitively adhered (fixed) during the lamination step (2), the pressurization step (3), and the cutting step (4) with good pressure-sensitive adhesive strength at normal temperature and, after the cutting step (4), capable of being released with decreasing the pressure-sensitive adhesiveness by heating (for example, see Patent Documents 1 to 5).

CITATION LIST

Patent Literature

Patent Document 1: JP-Y-50-13878
Patent Document 2: JP-B-51-24534
Patent Document 3: JP-A-56-61468
Patent Document 4: JP-A-56-61469
Patent Document 5: JP-A-60-252681

SUMMARY OF THE INVENTION

Problem that the Invention is to Solve

However, with a recent trend for high lamination, since a warp occurring at the lamination of green sheets in a green sheet laminate becomes large, there arises a problem that the warp in the green sheet laminate is not completely suppressed and hence peeling is generated during steps in the case where the pressure-sensitive adhesive strength of the pressure-sensitive adhesive layer for temporary fixing that is used for affixing to a pedestal is low. With regard to the problem, it is appropriate to use a strongly adhesive pressure-sensitive adhesive as a pressure-sensitive adhesive for forming the pressure-sensitive adhesive layer for temporary fixing. However, for example, when a conventional common strongly adhesive pressure-sensitive adhesive tape or sheet is used, lateral displacement is prone to occur in the pressure-sensitive adhesive layer for temporary fixing itself in the case where a force such as a pressing pressure at the time of laminating green sheets is continuously imparted, and there sometimes arise problems such as a decrease in electrode accuracy at the time of laminating green sheets Therefore, an object of the present invention is to provide a double-sided pressure-sensitive adhesive tape or sheet capable of effectively maintaining a state that an adherend is fixed to a pedestal even when a stress resulting from a warp is generated therein at the time of carrying out processing of the adherend in such a state that the tape or sheet is fixed to the pedestal through a pressure-sensitive adhesive layer for temporary fixing and the adhered is affixed on a heat-releasable pressure-sensitive adhesive layer, also capable of suppressing or preventing lateral displacement that may result from pressurization even when there is a pressurization step at the processing of the adherend, and capable of easily releasing a processed article by heating without damage after carrying out the processing of the adherend, as well as a method of processing an adherend using the double-sided pressure-sensitive adhesive tape or sheet.

Means for Solving the Problem

As a result of earnest investigations for achieving the above object, the present inventors have found that, when a double-sided pressure-sensitive adhesive tape or sheet comprising a heat-releasable pressure-sensitive adhesive layer and a pressure-sensitive adhesive layer for temporary fixing having a specific characteristic is used, a state that an adherend is strongly fixed to a pedestal can be effectively maintained to suppress a warp of the adherend even when the adherend is a green sheet laminate where green sheets are highly laminated and a large stress resulting from the warp is generated in the adherend at the time of carrying out processing of the adherend in such a state that the tape or sheet is fixed to the pedestal through the pressure-sensitive adhesive layer for temporary fixing and the adhered is affixed on the heat-releasable pressure-sensitive adhesive layer, also a processing step can be carried out in an excellent processing accuracy with suppressing or preventing lateral displacement that may result from pressurization even when there is a pressurization step by a pressing pressure or the like at the processing of the adherend, and the processed article can be easily released by heating without damage after carrying out the processing of the adherend. The present invention has been accomplished based on these findings.

That is, the present invention provides a double-sided pressure-sensitive adhesive tape or sheet, comprising a heat-releasable pressure-sensitive adhesive layer containing a heat-expandable microsphere on one side of a substrate, and a pressure-sensitive adhesive layer for temporary fixing on another side of the substrate, wherein the pressure-sensitive adhesive layer for temporary fixing has a tensile pressure-sensitive adhesive strength of 2.0 to 20 N/20 mm in width and an amount of displacement of 0.3 mm/20 mm in width or less, and the pressure-sensitive adhesive layer for temporary fixing is crosslinked with an isocyanate or epoxy crosslinking agent.

In the double-sided pressure-sensitive adhesive tape or sheet according to the present invention, the pressure-sensitive adhesive layer for temporary fixing preferably has a characteristic that a gel fraction is 50% by weight or more.

The present invention further provides a method of processing an adherend by using a double-sided pressure-sensitive adhesive tape or sheet, the method comprising the steps of: fixing the above-mentioned double-sided pressure-sensitive adhesive tape or sheet to a pedestal through the pressure-sensitive adhesive layer for temporary fixing; and carrying out processing of the adherend it such a state that the adhered is affixed on the heat-releasable pressure-sensitive adhesive layer. In the method of processing an adherend, an electronic component can be used as the adherend. Further, the adherend may be a green sheet for a ceramic capacitor and the method of processing an adherend may further comprise a step of laminating green sheets.

The present invention further provides an electronic component or multilayer ceramic capacitor fabricated by the above-mentioned method of processing an adherend.

Advantage of the Invention

Since the double-sided pressure-sensitive adhesive tape or sheet of the present invention has the above constitution, a state that an adherend is fixed to a pedestal can be effectively maintained even when a stress resulting from a warp is generated therein at the time of carrying out processing of the adherend in such a state that the tape or sheet is fixed to the pedestal through a pressure-sensitive adhesive layer for temporary fixing and the adhered is affixed on a heat-releasable pressure-sensitive adhesive layer, lateral displacement that may result from pressurization can be also suppressed or prevented even when there is a pressurization step at the processing of the adherend, and the processed article can be easily released by heating without damage after carrying out the processing of the adherend.

BRIEF DESCRIPTION OF TUE DRAWINGS

FIG. 2-(a) to FIG. 2-(c) are schematic views showing a method of evaluating pedestal holding ability in Examples.

MODE FOR CARRYING OUT THE INVENTION

The following will explain modes for carrying out the present invention in detail with reference to Drawings according to need. Incidentally, the same numeral or sign may be put to the same member or portion in some cases.

[Double-Sided Pressure-Sensitive Adhesive Tape or Sheet]

The double-sided pressure-sensitive adhesive tape or sheet of the present invention is a double-sided pressure-sensitive adhesive tape or sheet comprising, on one side of a substrate, a heat-releasable pressure-sensitive adhesive layer containing a heat-expandable microsphere, and a pressure-sensitive adhesive layer for temporary fixing on another side of the substrate, in which the pressure-sensitive adhesive layer for temporary fixing has a tensile pressure-sensitive adhesive strength of 2.0 to 20 N/20 mm in width and an amount of displacement is 0.3 mm/20 mm in width, or less, and the pressure-sensitive adhesive layer for temporary fixing is crosslinked with an isocyanate or epoxy crosslinking agent.

Figure 1:
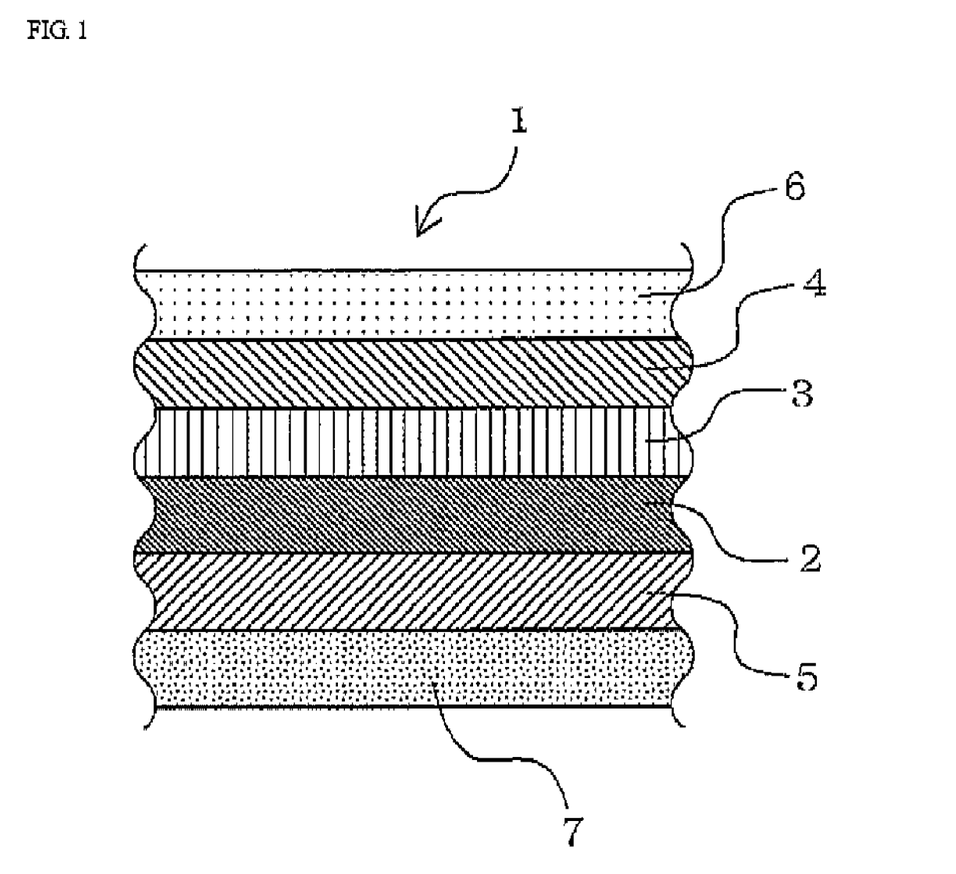
FIG. 1 is a schematic cross-sectional view partially showing an example of the double-sided pressure-sensitive adhesive tape or sheet of the present invention.

FIG. 1 is a schematic cross-sectional view partially showing an example of the double-sided pressure-sensitive adhesive tape or sheet of the present invention. In FIG. 1, the numeral 1 is a double-sided pressure-sensitive adhesive tape or sheet, the numeral 2 is a substrate, the numeral 3 is a rubber-like organic elastic layer (interlayer), the numeral 4 is a heat-releasable pressure-sensitive adhesive layer, the numeral 5 is a pressure-sensitive adhesive layer for temporary fixing, the numeral 6 is a separator, and the numeral 7 is a separator. The double-sided pressure-sensitive adhesive tape or sheet 1 shown in FIG. 1 has a constitution that the rubber-like organic elastic layer 3 and the heat-releasable pressure-sensitive adhesive layer 4 are formed on one side of the substrate 2 in this order and the pressure-sensitive adhesive layer for temporary fixing 5 is formed on another side of the substrate 2. Incidentally, the rubber-like organic elastic layer 3 is an arbitrarily arranged layer. Moreover, the surface (pressure-sensitive adhesive surface) of the heat-releasable pressure-sensitive adhesive layer 4 is protected by the separator 6 and the surface (pressure-sensitive adhesive surface) of the pressure-sensitive adhesive layer for temporary fixing 5 is protected by the separator 7 but these separator 6 and separator 7 are arbitrarily used.

<Pressure-Sensitive Adhesive Layer for Temporary Fixing>

In the double-sided pressure-sensitive adhesive tape or sheet of the present invention, the pressure-sensitive adhesive layer for temporary fixing has a tensile pressure-sensitive adhesive strength of 2.0 to 20 N/20 mm in width and an amount of displacement of 0.3 mm/20 mm in width or less and the pressure-sensitive adhesive layer for temporary fixing is crosslinked with an isocyanate or epoxy crosslinking agent. In the Description, the value of "tensile pressure-sensitive adhesive strength" refers to the value measured by the measurement method to be mentioned later under conditions of "with respect to SUS 304BA plate, peeling angle: 180°, tensile speed: 300 mm/min, temperature: 23±2° C., humidity: 65±5% RH" and the "amount of displacement" refers to the value measured by the measurement method to be mentioned later under conditions of "adherend: SUS 304BA plate, adhesion area 20 mm in width×10 mm in length, standing conditions before loading; 23±2° C.×30 minutes, load: 200 g, and standing conditions after loading: 232° C.×60 minutes".

When the tensile pressure-sensitive adhesive strength of the pressure-sensitive adhesive layer for temporary fixing is less than 2.0 N/20 mm in width, in the case where the double-sided pressure-sensitive adhesive tape or sheet is affixed to a pedestal through the pressure-sensitive adhesive layer for temporary fixing, when a stress is generated in the adherend due to a warp or the like, the double-sided pressure-sensitive adhesive tape or sheet is peeled off from the pedestal during the processing of the adherend affixed on the heat-releasable pressure-sensitive adhesive layer, so that defect in accuracy of a material to be processed (processed article) obtained by the processing of the adherend and thus the yield decreases. When the tensile pressure-sensitive adhesive strength of the pressure-sensitive adhesive layer for temporary fixing is larger than 20 N/20 mm in width, adhesive deposit and tape tearing are prone to occur at peeling.

The tensile pressure-sensitive adhesive strength of the pressure-sensitive adhesive layer for temporary fixing can be controlled so as to be 2.0 to 20 (N/20 mm in width), for example, by crosslinking a pressure-sensitive adhesive component (base polymer) of a pressure-sensitive adhesive such as an acrylic pressure-sensitive adhesive with adding an isocyanate crosslinking agent or an epoxy crosslinking agent in an amount of 0.01 to 20 parts by weight, preferably 0.02 to 10 parts by weight based on 100 parts by weight of the pressure-sensitive adhesive component. The amount of the crosslinking agent to be added varies depending on the functional group of monomers to be crosslinked and the type of the crosslinking agent and in the case of a more easily crosslinkable combination, a gel fraction increases even in a small amount of the crosslinking agent. As specific examples of the isocyanate crosslinking agent and the epoxy crosslinking agent, those exemplified below can be mentioned.

Moreover, during processing, in order to maintain accuracy of processing an adherend, it is important that lateral displacement of the double-sided pressure-sensitive adhesive tape or sheet is small. Therefore, the pressure-sensitive adhesive layer for temporary fixing has a character that the amount of displacement becomes 0.3 mm/20 mm in width or less (for example, 0 to 0.3 mm/20 mm in width). When the amount of displacement of the pressure-sensitive adhesive layer for temporary fixing is more than 0.3 mm/20 mm in width, lateral displacement of the double-sided pressure-sensitive adhesive tape or sheet or the adherend occurs during the processing treatment of the adherend affixed on the heat-releasable pressure-sensitive adhesive layer and processing accuracy decreases.

On the other hand, the amount of displacement of the pressure-sensitive adhesive layer for temporary fixing is preferably 0.2 mm/20 mm in width or less and further suitably 0.15 mm/20 mm in width or less. In this regard, the lower limit of the amount of displacement of the pressure-sensitive adhesive layer for temporary fixing is not limited particularly. A smaller amount is more preferred and it may be 0 mm/20 mm in width.

Incidentally, the amount of displacement of the pressure-sensitive adhesive layer for temporary fixing can be controlled so as to be 0.3 mm/20 mm in width or less, for example, by crosslinking a pressure-sensitive adhesive component (base polymer) of a pressure-sensitive adhesive such as an acrylic pressure-sensitive adhesive with adding an isocyanate crosslinking agent or an epoxy crosslinking agent in an amount of 0.01 to 20 parts by weight, preferably 0.02 to 10 parts by weight based on 100 parts by weight of the pressure-sensitive adhesive component. The amount of the crosslinking agent to be added varies depending on the functional group of monomers to be crosslinked and the type of the crosslinking agent and in the ease of a more easily crosslinkable combination, a gel fraction increases even in a small amount of the crosslinking agent. As specific examples of the isocyanate crosslinking agent and the epoxy crosslinking agent, those exemplified below can be mentioned.

In the present invention, the tensile pressure-sensitive adhesive strength of the pressure-sensitive adhesive layer for temporary fixing can be determined by the following (Method of Measuring Tensile Pressure-Sensitive Adhesive Strength).

(Method of Measuring Tensile Pressure-Sensitive Adhesive Strength)

A double-sided pressure-sensitive adhesive tape or sheet is cut into a size of 20 mm in width and 100 mm in length and this is affixed to an SUS 304BA plate (stainless steel plate) under pressure by a method of allowing a 2-kg roller to move to and from thereon once under conditions of an ordinary temperature (23° C.±2° C.) and a humidity of 65±5% RH in such a form that the pressure-sensitive adhesive layer for temporary fixing is in contact with the SUS 304BA plate, followed by standing for 30 minutes. After standing, the load (maximum load) at the time when the double-sided pressure-sensitive adhesive tape or sheet is peeled off from the SUS 304BA plate under conditions of a peeling angle of 180° and a tensile speed of 300 mm/min is measured in accordance with JIS Z 0237 under conditions of a temperature of 2.3±2° C. and a humidity of 65±5% RH, thereby determining the tensile pressure-sensitive adhesive strength (N/20 mm in width; with respect to an SUS 304BA plate; peeling angle: 180', tensile speed: 300 mm/min, temperature: 23±2° C., humidity: 65±5% RH).

Moreover, the amount of displacement of the pressure-sensitive adhesive layer for temporary fixing is determined by the following (Method of Measuring Amount of Displacement).

(Method of Measuring Amount of Displacement)

A double-sided pressure-sensitive adhesive tape or sheet is cut into a size of 20 mm in width and 100 min in length and this is affixed to an SUS 304BA plate under pressure in an adhesion area of 20 mm in width and 10 mm in length by a method of allowing a 2-kg roller to move to and from thereon once under conditions of an ordinary temperature (23° C.±2° C.) and a humidity of 65±5% RH in such a form that the pressure-sensitive adhesive layer for temporary fixing is in contact with the SUS 304BA plate, followed by standing for 30 minutes at 23±2° C. After standing, a load of 200 g is applied to an end part of the double-sided pressure-sensitive adhesive tape or sheet and the degree of displacement (amount of displacement) from the state of the affixing under pressure is measured in accordance with the measuring method of holding power specified in 315 Z 0237 and thus the amount of displacement at 23±2° C. after 60 minutes (mm/20 mm in width; adherend: SUS 304BA plate; adhesion area: 20 mm in width×10 mm in length, standing conditions before loading: 23±2° C.×30 minutes, load: 200 g, and standing conditions after loading: 23±2° C.×60 minutes) is determined.

The pressure-sensitive adhesive for forming the pressure-sensitive adhesive layer for temporary fixing is not particularly limited as long as it is a pressure-sensitive adhesive capable of forming a pressure-sensitive adhesive layer that exhibits the above characteristics, and can be selected as appropriate from among known pressure-sensitive adhesives. Examples of such known pressure-sensitive adhesives include various pressure-sensitive adhesives such as rubber pressure-sensitive adhesives, acrylic pressure-sensitive adhesives, silicone pressure-sensitive adhesives, vinyl alkyl ether pressure-sensitive adhesives, polyester pressure-sensitive adhesives, polyamide pressure-sensitive adhesives, urethane pressure-sensitive adhesives, and fluorine-containing pressure-sensitive adhesives, and creep property-improved pressure-sensitive adhesives obtained by blending a heat-meltable resin having a melting point of about 200° C. or lower with these pressure-sensitive adhesives (for example, see JP-A-56-61468, JP-A-61-174857, JP-A-53-17981, and JP-A-56-13040). These pressure-sensitive adhesives can be used alone or in combination of two or more thereof.

As the pressure-sensitive adhesives, preferred are rubber pressure-sensitive adhesives and acrylic pressure-sensitive adhesives, of which acrylic pressure-sensitive adhesives can be particularly preferably used. Specific examples of the rubber pressure-sensitive adhesives and the acrylic pressure-sensitive adhesives include rubber pressure-sensitive adhesives (natural rubbers and rubber pressure-sensitive adhesives containing various synthetic rubbers as base polymers) and acrylic pressure-sensitive adhesives [acrylic pressure-sensitive adhesives containing, as a base polymer, acrylic polymers (homopolymers or copolymers) in which alkyl esters of (meth)acrylic acid are used as monomer components)], which are exemplified specifically in the following.

As the rubber pressure-sensitive adhesives, there may be mentioned rubber pressure-sensitive adhesives containing natural rubbers or various synthetic rubbers [e.g., polyisoprene rubber, styrene-butadiene block copolymer (SB) rubber, styrene-isoprene block copolymer (SI) rubber, styrene-isoprene-styrene block copolymer (SIS) rubber, styrene-butadiene-styrene block copolymer (SBS) rubber, styrene-isoprene-butadiene-styrene block copolymer (SIBS) rubber, styrene-ethylene-butylene-styrene block copolymer (SEBS) rubber, styrene-ethylene-propylene-styrene block copolymer (SEPS) rubber, styrene-ethylene-propylene block copolymer (SEP) rubber, reclaimed rubber, butyl rubber, polyisobutylene, and modified products thereof] as a base polymer.

As the acrylic pressure-sensitive adhesives, there may be mentioned acrylic pressure-sensitive adhesives containing, as a base polymer, acrylic polymers (homopolymers or copolymers) containing one or two or more alkyl esters of (meth) acrylic acid as monomer components. Examples of the alkyl esters of (meth)acrylic acid in the acrylic pressure-sensitive adhesives include $C_{1-20}$ alkyl esters of (meth)acrylic acid [preferably, $C_{4-18}$ alkyl (linear or branched alkyl) esters of (meth)acrylic acid], such as methyl(meth)acrylates, ethyl (meth)acrylates, propyl(meth)acrylates, isopropyl(meth) acrylates, butyl(meth)acrylates, isobutyl(meth)acrylates, s-butyl(meth)acrylates, t-butyl(meth)acrylates, pentyl(meth) acrylates, hexyl(meth)acrylates, heptyl(meth)acrylates, octyl (meth)acrylates, 2-ethylhexyl(meth)acrylates, isooctyl (meth)acrylates, nonyl(meth)acrylates, isononyl(meth) acrylates, decyl(meth)acrylates, isodecyl(meth)acrylates, undecyl(meth)acrylates, dodecyl(meth)acrylates, tridecyl (meth)acrylates, tetradecyl(meth)acrylates, pentadecyl (meth)acrylates, hexadecyl(meth)acrylates, heptadecyl (meth)acrylates, octadecyl(meth)acrylates, nonadecyl(meth) acrylates, and eicosyl(meth)acrylates; and the like.

Where necessary, the acrylic polymers may further contain unit(s) corresponding to other monomer component(s) copolymerizable with the alkyl esters of (meth)acrylic acid, for the purpose of modifying cohesive force, heat resistance, crosslinking ability, and the like. Examples of such monomer components include carboxyl group-containing monomers such as acrylic acid, methacrylic acid, itaconic acid, maleic acid, fumaric acid, crotonic acid, and carboxyethyl acrylate; acid anhydride group-containing monomers such as maleic anhydride and itaconic anhydride; hydroxyl-group containing monomers such as hydroxyethyl(meth)acrylates, hydroxypropyl(meth)acrylates, and hydroxybutyl(meth)acrylates; (N-substituted or unsubstituted) amide monomers such as (meth)acrylamides, N,N-dimethyl(meth)acrylamides, N-butyl(meth)acrylamides, N-methylol(meth)acrylamides, and N-methylolpropane(meth)acrylamides; vinyl ester monomers such as vinyl acetate and vinyl propionate; styrenic monomers such as styrene and α-methylstyrene; vinyl ether monomers such as vinyl methyl ether and vinyl ethyl ether; cyano acrylate monomers such as acrylonitrile and methacrylonitrile; epoxy group-containing acrylic monomers such as glycidyl(meth)acrylates; olefinic or dienic monomers such as ethylene, propylene, isoprene, butadiene, and isobutylene; (substituted or unsubstituted) amino group-containing monomers such as aminoethyl(meth)acrylates, N,N-dimethylaminoethyl(meth)acrylates, and t-butylaminoethyl(meth)acrylates; alkoxyalkyl(meth)acrylate monomers such as methoxyethyl(meth)acrylates and ethoxyethyl(meth)acrylates; monomers having a nitrogen atom-containing ring, such as N-vinylpynolidone, N-methylvinylpyrrolidone, N-vinylpyridine, N-vinylpiperidone, N-vinylpyrimidine, N-vinylpiperazine, N-vinylpyrazine, N-vinylpyrrole, N-vinylimidazole, N-vinyloxazole, N-vinylmorpholine, and N-vinylcaprolactam; N-vinylcarboxamides; sulfanic acid group-containing monomers such as styrenesulfonic acid, allylsulfonic acid, (meth)acrylamidopropanesulfonic acids, and sulfopropyl(meth)acrylates; phosphoric acid group-containing monomers such as 2-hydroxyethylacryloyl phosphate; maleimide monomers such as N-cyclohexylmaleimide, N-isopropylmaleimide, N-laurylmaleimide, and N-phenylmaleimide; itaconimide monomers such as N-methylitaconimide, N-ethylitacoimide, N-butylitaconimide, N-octylitaconimide, N-2-ethylhexylitaconimide, N-cyclohexylitaconimide, and N-laurylitaconimide; succinimide monomers such as N-(meth)acryloyloxymethylenesuccinimides, N-(meth)acryloyl-6-oxyhexamethylenesuccinimides, and N-(meth)acryloyl-8-oxyoctamethylenesuccinimides; glycol acrylic ester monomers such as polyethylene glycol (meth)acrylates and polypropylene glycol(meth)acrylates; monomers having an oxygen atom-containing heterocycle such as tetrahydrofurfuryl(meth)acrylates; acrylic ester monomers containing a fluorine atom such as fluoro-(meth) acrylates; acrylic ester monomers containing a silicon atom, such as silicone(meth)acrylates; and polyfunctional monomers such as hexanediol di(meth)acrylates, (poly)ethylene glycol di(meth)acrylates, (poly) propylene glycol di(meth) acrylates, neopentyl glycol di(meth)acrylates, pentaerythritol di(meth)acrylates, trimethylolpropane tri(meth)acrylates, pentaerythritol tri(meth)acrylates, dipentaerythritol hexa(meth)acrylates, epoxy acrylates, polyester acrylates, urethane acrylates, divinylbenzene, butyl di(meth)acrylates, and hexyl di(meth)acrylates. One or two or more of these monomer components can be used.

In order to control the tensile pressure-sensitive adhesive strength and an amount of displacement of the pressure-sensitive adhesive layer for temporary fixing to desired ranges, the pressure-sensitive adhesive may contain a suitable additive such as a crosslinking agent (e.g., polyisocyanate, epoxy compound), a tackifier (e.g., one that is solid, semi-solid, or liquid at ordinary temperature, formed of a rosin derivative resin, polyterpene resin, petroleum resin, phenol resin, or the like), a plasticizer, a filler, and an antiaging agent according to the type of the pressure-sensitive adhesive, in addition to polymer components such as a pressure-sensitive adhesive component (base polymer). The pressure-sensitive adhesive may be either form of an emulsion pressure-sensitive adhesive, solvent pressure-sensitive adhesive, and the like. In addition, the pressure-sensitive adhesive layer for temporary fixing is not heat-releasable because it is free from heat-expandable microspheres.

In the present invention, the pressure-sensitive adhesive layer for temporary fixing preferably has a gel fraction of 50% by weight or more, and particularly suitably 60% by weight or more (especially, 70% by weight or more), in order to suppress or prevent lateral displacement of an adherend affixed on the heat-releasable pressure-sensitive adhesive layer during processing. When the gel fraction of the pressure-sensitive adhesive layer for temporary fixing is less than 50% by weight, there may be a case where the pressure-sensitive adhesive layer for temporary fixing itself is extremely prone to deform under severe conditions of high temperature and long time at pressing and the like, and there may occur lateral displacement of the pressure-sensitive adhesive layer for temporary fixing itself, so that the accuracy of processing an adherend may be adversely affected.

The gel fraction of the pressure-sensitive adhesive layer for temporary fixing can be determined by the following (Method of Measuring Gel Fraction).

(Method of Measuring Gel Fraction)

A portion of the pressure-sensitive adhesive layer for temporary fixing alone is collected from a double-sided pressure-sensitive adhesive tape or sheet and weighed to determine its weight, and this weight is defined as a weight before immersion (A). Next, after the portion of the pressure-sensitive adhesive layer for temporary fixing alone is immersed in toluene at ordinary temperature (23±2° C.) for 72 hours, an unsolved portion is taken out, from which toluene is completely evaporated using an oven or the like. The dried unsolved portion is weighed to determine its weight and this weight is defined as a weight after immersion (B).

A gel fraction is calculated according to the following Equation (1):

$$\text{Gel fraction (\% by weight)} = (B/A) \times 100 \quad (1)$$

(In Equation (1), "A" represents the weight before immersion; and "B" represents the weight after immersion).

The gel fraction of the pressure-sensitive adhesive layer for temporary fixing can be controlled, for example, by using a crosslinking agent. As the crosslinking agent for used in the fabrication of the pressure-sensitive adhesive layer for temporary fixing, isocyanate crosslinking agents or epoxy crosslinking agents are used. The crosslinking agents may be used alone or in combination of two or more thereof.

Specifically, example of the isocyanate crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, use can be made of a trimethylolpropane/tolylene diisocyanate trimer adduct [available from Nippon Polyurethane Industry Co., Ltd., trade name "Coronate L"] and a trimethylolpropane/hexamethylene diisocyanate trimer adduct [available from Nippon Polyurethane Industry Co., Ltd, trade name "Coronate HL"].

Examples of the epoxy crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropane polyglycidyl ether, diglycidyl ester of adipic acid, diglycidyl ester of o-phthalic acid, triglycidyl-tris(2-hydroxyethyl)isocyanurate, resorcin diglycidyl ether, and bisphenol-S-diglycidyl ether; and epoxy resins having two or more epoxy groups in a molecule.

The amount of such a crosslinking agent to be used can be set as appropriate depending on the objective gel fraction of the pressure-sensitive adhesive layer for temporary fixing, the type of the crosslinking agent, the type of the pressure-sensitive adhesive, and the like. Specifically, the amount of the crosslinking agent to be used can be selected from the range of, for example, 0.01 to 20 parts by weight, preferably 0.02 to 10 parts by weight based on 100 parts by weight of the base polymer in the pressure-sensitive adhesive. When two or more crosslinking agents are used, the amount of the crosslinking agent to be used represents total amount thereof.

In the present invention, it is also possible to form the pressure-sensitive adhesive layer for temporary fixing by performing a crosslinking treatment through irradiation with an electron beam or an ultraviolet ray together with the use of the crosslinking agent.

The thickness of the pressure-sensitive adhesive layer for temporary fixing is not particularly limited and, for example, can be appropriately selected from the range of 0.5 to 100 μm, preferably 2 to 50 μm. When the pressure-sensitive adhesive layer for temporary fixing is too thin, a sufficient pressure-sensitive adhesiveness cannot be obtained and peeling from the pedestal or lateral displacement may be caused in some cases. When it is too thick, the deformation of the pressure-sensitive adhesive layer increases and a decrease in accuracy resulting from lateral displacement during processing may be caused in some cases. Incidentally, the pressure-sensitive adhesive layer for temporary fixing may have either of a single layer structure and a multilayer structure.

The method of forming the pressure-sensitive adhesive layer for temporary fixing is not particularly limited and can be appropriately selected from among known methods of forming a pressure-sensitive adhesive layer. Specifically, examples of the method of forming the pressure-sensitive adhesive layer for temporary fixing include a method of applying a pressure-sensitive adhesive composition obtained by mixing a pressure-sensitive adhesive, a crosslinking agent, and, where necessary, other additives to a predetermined surface (substrate or the like) and drying or curing it according to necessity, and a method of applying the pressure sensitive adhesive composition to a suitable separator (release paper or the like), drying or curing it according to need to form a pressure-sensitive adhesive layer, and subsequently transferring the pressure-sensitive adhesive layer to a predetermined surface (substrate or the like).

<Heat-Releasable Pressure-Sensitive Adhesive Layer>

The heat-releasable pressure-sensitive adhesive layer (heat-expandable pressure-sensitive adhesive layer) can be formed from a pressure-sensitive adhesive composition containing a heat-expandable microsphere. Thus, since the heat-releasable pressure-sensitive adhesive layer contains the heat-expandable microsphere, the heat-expandable microsphere is foamed or expanded by heating and the releasability can be exhibited due to the foaming or expansion of the heat-expandable microsphere. In this regard, it is important that the heat-releasable pressure-sensitive adhesive layer contains the heat-expandable microsphere in such a content that a predetermined release initiating temperature is exhibited. The heat-expandable microsphere can be used alone or in combination of two or more thereof.

The heat-expandable microsphere is not particularly limited, and can be selected as appropriate from among known heat-expandable microspheres (various inorganic heat-expandable microspheres, organic heat-expandable microspheres, etc.). As the heat-expandable microsphere, from the viewpoint of easiness of mixing operation, a microcapsulated foaming agent can be suitably used. Examples of such a heat-expandable microsphere include microspheres containing a material that easily gasifies and expands by heating (heat-expandable material), such as isobutane, propane, or pentane, encapsulated in an elastic shell. The shell is often formed of a hot-melt material or a material that breaks due to thermal expansion. Examples of the material forming the shell include vinylidene chloride-acrylonitrile copolymers, polyvinyl alcohol, polyvinyl butyral, polymethyl methacrylate, polyacrylonitrile, polyvinylidene chloride, and polysulfones. The heat-expandable microsphere can be prepared according to a common procedure such as a coacervation method or an interfacial polymerization method. The heat-expandable microspheres also include commercially available products such as, trade name "Matsumoto Microsphere" (available from Matsumoto Yushi-Seiyaku Co., Ltd.).

In the heat-expandable microsphere, the release initiation temperature to be imparted can be controlled to an appropriate temperature depending on the kind of the heat-expandable material (particularly vaporization temperature), the kind of the material that forms the shell, the thickness of the shell, the particle diameter of the heat-expandable microsphere, and the like.

The heat-expandable microsphere is preferably a heat-expandable microsphere having such an appropriate strength that it does not burst until the volume expansion ratio reaches 5 times or more, especially 7 times or more, and particularly 10 times or more, for efficient and stable reduction in adhesive strength of the heat-releasable pressure-sensitive adhesive layer by a heating treatment.

In the heat-releasable pressure-sensitive adhesive layer, the content (blending amount) of the heat-expandable microsphere can be set as appropriate according to the expansion ratio, reduction in adhesive strength and the like of the heat-releasable pressure-sensitive adhesive layer. It can be, for example, selected as appropriate from the range of 1 to 150 parts by weight, preferably 10 to 130 parts by weight, and more preferably 25 to 100 parts by weight based on 100 parts by weight of a base polymer of the pressure-sensitive adhesive that forms the heat-releasable pressure-sensitive adhesive layer.

The particle diameter (average particle diameter) of the heat-expandable microsphere can be selected as appropriate depending on the thickness and the like of the heat-releasable pressure-sensitive adhesive layer. The average particle diameter of the heat-expandable microsphere can be, for example, selected from the range of 100 μm or less, preferably 80 μm or less, further preferably 1 to 50 particularly 1 to 30 μm.

As the pressure-sensitive adhesive (pressure-sensing adhesive) for forming the heat-releasable pressure-sensitive adhesive layer, a pressure-sensitive adhesive that permits the heat-expandable microsphere to foam and/or expand at the time of heating the heat-releasable pressure-sensitive adhesive layer can be used and is preferably one that does not restrain the foaming and/or expansion of the heat-expandable microsphere as far as possible at the time of heating. The pressure-sensitive adhesive can be used alone or in combination of two or more thereof.

In the heat-releasable pressure-sensitive adhesive layer, the pressure-sensitive adhesive can be selected as appropriate from among known pressure-sensitive adhesives. Examples thereof include known pressure-sensitive adhesives such as various pressure-sensitive adhesives such as rubber pressure-sensitive adhesives, acrylic pressure-sensitive adhesives, silicone pressure-sensitive adhesives, vinyl alkyl ether pressure-sensitive adhesives, polyester pressure-sensitive adhesives, polyamide pressure sensitive adhesives, urethane pressure-sensitive adhesives, and fluorine-containing pressure-sensitive adhesives, and creep property-improved pressure-sensitive adhesives obtained by blending a heat-meltable resin having a melting point of about 200° C. or lower with these pressure-sensitive adhesives (for example, see JP-A-56-61468, JP-A-61-174857, JP-A-63-17981, JP-A-56-13040). These pressure-sensitive adhesives can be used alone or in combination of two or more thereof. The pressure-sensitive adhesive may contain suitable additives such as crosslinking agents (e.g., polyisocyanates, alkyl-etherified melamine compounds), tackifiers (e.g., those that are solid, semi-solid, or liquid at ordinary temperature, formed of rosin derivative resins, polyterpene resins, petroleum resins, phenol resins, or the like), plasticizers, fillers, and antiaging agents according to the kind or the like of the pressure-sensitive adhesive, in addition to a polymer component such as a pressure-sensitive adhesive component (base polymer). The pressure-sensitive adhesive may be either form of an emulsion pressure-sensitive adhesive, solvent pressure-sensitive adhesive or the like.

As the pressure-sensitive adhesives, preferred are rubber pressure-sensitive adhesives and acrylic pressure-sensitive adhesives, of which acrylic pressure-sensitive adhesives can be particularly suitably used. As the rubber pressure-sensitive adhesives and acrylic pressure-sensitive adhesives, those exemplified in the article of the above pressure-sensitive adhesive layer for temporary fixing can be used.

The heat-releasable pressure-sensitive adhesive layer can be, for example, formed by a conventional method in which the pressure-sensitive adhesive, the heat-expandable microsphere, and, where required, a solvent and other additives are mixed and formed into a sheet-like layer. Specifically, the heat-releasable pressure-sensitive adhesive layer can be formed by, for example, a method of applying a mixture containing a pressure-sensitive adhesive, a heat-expandable microsphere, and, where necessary, a solvent and other additives to a substrate or a rubber-like organic elastic layer, and a method of applying the mixture on a suitable separator (release paper or the like) to form a heat-releasable pressure-sensitive adhesive layer and transferring it to a substrate or a rubber-like organic elastic layer. Incidentally, the heat-releasable pressure-sensitive adhesive layer may have either of a single layer structure and a multilayer structure.

The thickness of the heat-releasable pressure-sensitive adhesive layer can be selected as appropriate depending on the reducing ability of the adhesive strength and, for example, can be selected from the range of 500 μm or less, and is preferably 300 μm or less (further preferably 100 μm or less). When the thickness of the heat-releasable pressure-sensitive adhesive layer is too thick (too large), the heat-releasable pressure-sensitive adhesive layer is prone to undergo cohesive failure after expansion or foaming by the heating treatment and there is a case where adhesive deposit (residue of pressure-sensitive adhesive components) that causes contamination may occur on the adherend (article to be adhered) after release. On the other hand, when the thickness of the heat-releasable pressure-sensitive adhesive layer is too thin (too small), a degree of deformation of the heat-releasable pressure-sensitive adhesive layer by the heating treatment may be small, a smooth decrease in the adhesive strength is less prone to occur, and also it becomes necessary to exceedingly reduce the particle diameter of the heat-expandable microsphere to be added. Therefore, the thickness of the heat-releasable pressure-sensitive adhesive layer is suitably 5

μm or more preferably 10 μm or more, and further preferably 15 μm or more. Needless to say, it is important that the thickness of the heat-releasable pressure-sensitive adhesive layer is thicker than the maximum particle diameter of the contained heat-expandable microsphere.

<Substrate>

The substrate can be used as a supporting base of the heat-releasable pressure-sensitive adhesive layer or the like. Incidentally, the substrate may have either of a single layer structure or a multilayer structure.

As the substrate, for example, use can be made of suitable thin materials including paper substrates such as papers; fibrous substrates such as fabrics, non-woven fabrics, felts, and nets; metallic substrates such as metal foils and metal plates; plastic substrates such as plastic films and sheets; rubber substrates such as rubber sheets; foams such as foamed sheets; laminates thereof [particularly, laminates of plastic substrates with other substrates, laminates of plastic films (or sheets) themselves, etc.]; and the like. As the substrate, those which are excellent in thermal resistance and are not melted at the heat treating temperature of the heat-releasable pressure-sensitive adhesive layer, are preferred in view of handleability after heating and the like. As the substrate, plastic substrates such as plastic films and sheets are preferably used. Examples of materials for such plastic substrates include olefinic resins containing an α-olefin as a monomer component, such as polyethylene (PE), polypropylene (PP), ethylene-propylene copolymers, and ethylene-vinyl acetate copolymers (EVA); polyesters such as polyethylene terephthalate (PET), polyethylene naphthalate (PEN), and polybutylene terephthalate (PBT); polyvinyl chloride (PVC); polyphenylene sulfide (PPS); amide resins such as polyamides (nylons) and wholly aromatic polyamides (aramids); and polyether ether ketone (PEEK). These materials may be used alone or in combination of two or more thereof.

In the case of using a plastic substrate as the substrate, its deformation properties such as degree of elongation may be controlled by stretching treatment or the like.

The thickness of the substrate can be selected as appropriate according to the strength, flexibility, and usage, and, for example, is generally, but is not limited to, about 1000 μm or less (for example, 1 to 1000 μm), preferably 1 to 500 μm, more preferably 3 to 300 μm, and particularly preferably about 5 to 250 μm.

The surfaces of the substrate may be subjected to a common surface treatment, for example, an oxidation treatment through chemical or physical process, such as a treatment with a chromic acid, exposure to ozone, exposure to flame, exposure to high tension electric shock, or ionizing radiation treatment, and to a coating treatment with a primer, in order to enhance adhesiveness to the heat-releasable pressure-sensitive adhesive layer, the pressure-sensitive adhesive layer for temporary fixing, and the like.

<Separator>

In the present invention, as the separator, a common release paper or the like can be used. The separator is used as a protective material for the heat-releasable pressure-sensitive adhesive layer or the pressure-sensitive adhesive layer for temporary fixing and is removed at the time when the double-sided pressure-sensitive adhesive tape or sheet is affixed to an adherend or a pedestal. The separator is not necessarily arranged.

Examples of the separator include base materials having a release layer, such as plastic films and papers which are surface-treated with a silicone-type, a long-chain alkyl-type, a fluorine-containing-type, or molybdenum sulfide release agent; base materials having low adhesiveness formed of a fluoro-polymer such as polytetrafluoroethylene, polychlorotrifluoroethylene, polyvinyl fluoride, polyvinylidene fluoride, a tetrafluoroethylene-hexafluoropropylene copolymer, and a chlorofluoroethylene-vinylidene fluoride copolymer; and base materials having low adhesiveness formed of a non-polar polymer such as olefinic resins (e.g., polyethylene or polypropylene).

The separator can be formed by a known or common procedure, and the thicknesses of the separator and the like are not particularly limited.

<Interlayer>

In the present invention, it is also possible to arrange one or more interlayers between the substrate and the heat-releasable pressure-sensitive adhesive layer, or between the substrate and the pressure-sensitive adhesive layer for temporary fixing. Examples of such interlayers include a coating layer of a release agent for the purpose of imparting the releasability; a coating layer of a primer for the purpose of improving the adhesive strength; and the like, as mentioned above. As the interlayers other than the coating layers of release agents and coating layers of primers, for example, there may be mentioned a layer for the purpose of imparting a good deforming ability; a layer for the purpose of increasing the adhesion area to the adherend; a layer for the purpose of improving the adhesive strength; a layer for the purpose of satisfactory following to the surface shape of the adherend; a layer for the purpose of improving treating ability for reducing the adhesive strength by heating; a layer for the purpose of improving the releasability from the adherend after heating; and the like.

Particularly, in view of imparting the deformation ability of the double-sided pressure-sensitive adhesive tape or sheet and improving the releasability thereof after heating, for example, a rubber-like organic elastic layer can be arranged as a layer (interlayer) between the substrate and the heat-releasable pressure-sensitive adhesive layer. By arranging the rubber-like organic elastic layer, when the double-sided pressure-sensitive adhesive tape or sheet is fixed and adhered to an adherend, the surface of the heat-releasable pressure-sensitive adhesive layer in the double-sided pressure-sensitive adhesive tape or sheet can satisfactorily follow the surface shape of the adherend to thereby provide a large adhesion area therebetween. Also, when the double-sided pressure-sensitive adhesive tape or sheet is heated and released from the adherend, the expansion of the heat-releasable pressure-sensitive adhesive layer under heating can be highly (precisely) controlled and the heat-releasable pressure-sensitive adhesive layer can be expanded preferentially and uniformly in a thickness direction. Incidentally, the rubber-like organic elastic layer is a layer arranged according to need and may be not necessarily arranged.

The rubber-like organic elastic layer is preferably arranged on the substrate side surface of the heat-releasable pressure-sensitive adhesive layer in such a form of being piled on the heat-releasable pressure-sensitive adhesive layer. Incidentally, it may be arranged as a layer other than the interlayer between the substrate and the heat-releasable pressure-sensitive adhesive layer. The rubber-like organic elastic layer may be present on one or both sides of the substrate.

The rubber-like organic elastic layer is, for example, preferably formed of a natural rubber, a synthetic rubber, or a synthetic resin having rubber elasticity, which has a D-type Shore D hardness based on ASTM D-2240 of 50 or less and particularly 40 or less.

Examples of the synthetic rubber and synthetic resin having rubber elasticity include synthetic rubbers such as nitrite, diene, and acrylic synthetic rubbers; thermoplastic elastomers such as polyolefinic and polyester elastomers; and synthetic resins having rubber elasticity, such as ethylene-vinyl acetate copolymers, polyurethanes, polybutadiene, and soft polyvinyl chloride. Even a polymer is originally rigid one, such as polyvinyl chloride, it can exhibit rubber elasticity by combining it with a compounding agent such as a plasticizer or a flexibilizer. Thus, such a composition can also be used as a material for constituting the rubber-like organic elastic layer. In addition, a pressure-sensitive adhesive material such as a pressure-sensitive adhesive constituting the heat-releasable pressure-sensitive adhesive layer can also preferably be used as a material for constituting the rubber-like organic elastic layer.

The rubber-like organic elastic layer may be formed, for example, by a forming procedure such as a procedure of applying on the substrate a coating liquid containing the material for forming a rubber-like organic elastic layer, such as a natural rubber, a synthetic rubber, or a synthetic resin having rubber elasticity (coating method), a procedure of adhering to the substrate a film formed of the material for forming the rubber-like organic elastic layer or a multilayer film obtained by arranging a layer formed of the material for forming a rubber-like organic elastic layer on one or more layers of the heat-releasable pressure-sensitive adhesive layer (dry lamination method), or a procedure of coextruding a resin composition containing the material for constituting the substrate and a resin composition containing the material for forming a rubber-like organic elastic layer (coextrusion method).

The thickness of the rubber-like organic elastic layer is generally 500 µm or less (e.g., 1 to 500 µm), preferably 3 to 300 µm, and more preferably about 5 to 150 µm. The rubber-like organic elastic layer may have a single-layer structure or may be constituted by two or more layers.

The rubber-like organic elastic layer may be formed of a pressure-sensitive adhesive material containing a natural rubber, a synthetic rubber, or a synthetic resin having rubber elasticity as a main component, or may be formed of a foamed film mainly containing such a component. The foaming can be carried out by a common method such as a method through mechanical agitation, a method of utilizing a gas formed in a reaction, a method of utilizing a foaming agent, a method of removing a soluble material, a method through spraying, a method of forming a syntactic foam, or a sintering method.

The double-sided pressure-sensitive adhesive tape or sheet of the present invention can be prepared by forming the heat-releasable pressure-sensitive adhesive layer on one side of the substrate, where necessary, through the other layers (rubber-like organic elastic layer etc.) and also forming the pressure-sensitive adhesive layer for temporary fixing on another side of the substrate. The double-sided pressure-sensitive adhesive tape or sheet may have an appropriate form such as a sheet form or a tape form wound into a roll.

The double-sided pressure-sensitive adhesive tape or sheet of the present invention, which is provided with the pressure-sensitive adhesive layer for temporary fixing having specific characteristics, can be affixed to a pedestal without the occurrence of peeling and lateral displacement when it is affixed to the pedestal through the pressure-sensitive adhesive layer for temporary fixing. Therefore, at the time of processing of an adherend, the double-sided pressure-sensitive adhesive tape or sheet of the present invention can fix the adherend on the pedestal in a stable position without the occurrence of peeling and lateral displacement with exhibiting an excellent adhesiveness during various processing steps (lamination step, cutting step, pressurization step, etc.), even when a stress resulting from a warp is generated in the adherend and a pressure that may cause the lateral displacement is imparted during the pressurization step and the like, at the time when the adherend is fixed on the pedestal by affixing the adherend on the heat-releasable pressure-sensitive adhesive layer and also affixing the pressure-sensitive adhesive layer for temporary fixing on the pedestal. Furthermore, after processing, the processed article (material to be processed) obtained by the processing of the adherend can be easily released. Accordingly, it can exhibit an excellent adhesiveness for fixing at the time of the processing of the adherend to impart processability with an excellent processing accuracy to the adherend and also, when it is intended to resolve the adhered state after the purpose of pressure-sensitive adhesion is achieved, the adherend or the processed article can be easily released or separated through reduction of the adhesive strength by heating.

Thus, the double-sided pressure-sensitive adhesive tape or sheet of the present invention can be suitably used as a heat-releasable double-sided pressure-sensitive adhesive tape or sheet for use in the processing of an adherend. Namely, the double-sided pressure-sensitive adhesive tape or sheet of the present invention can, for example, be suitably used in a usage in which the adherend (article to be processed) can be adhered with strong adhesive strength at the time of processing and, after processing, the adhered state can be rapidly resolved. The use of the double-sided pressure-sensitive adhesive tape or sheet enables processing of the adherend with an excellent processing accuracy.

The method of processing an adherend can be arbitrarily selected. Examples thereof include processes such as cutting processes (polishing process, dicing process, etc.); processes of printing electrodes on green sheets (patterning process etc.); and assembly process, as shown below, and also include processes in lamination steps; processes in pressurization steps; processes at firing steps, and the like.

Moreover, the double-sided pressure-sensitive adhesive tape or sheet of the present invention can be also used as a protecting member upon conveying an adherend.

[Method of Processing Adherend]

In the method of processing an adherend (article to be processed) according to the present invention, the adherend is processed by carrying out processing of the adherend while the double-sided pressure-sensitive adhesive tape or sheet is fixed to a pedestal through the pressure-sensitive adhesive layer for temporary fixing and the adherend is affixed to the heat-releasable pressure-sensitive adhesive layer. The steps in the processing of an adherend can be arbitrarily selected and may contain a pressurization step (pressing step under pressure), a lamination step, and a cutting step in fabrication of electronic components; and a grinding step and a cutting step in fabrication of semiconductor components. More specifically, examples of the steps in the processing of an adherend include steps of printing electrodes on green sheets (patterning step, etc.); lamination steps; pressurization steps (pressing steps under pressure); cutting steps (polishing step, dicing step, etc.); grinding steps (back-grinding step etc.); and firing steps; and also include assembly steps.

After the completion of processing of the adherend (typically after the purpose of pressure-sensitive adhesion has been achieved or when the adhesion state is to be resolved), the adherend subjected to processing (processed article) can be released or separated by heating to a temperature equal to or higher than the foam initiating temperature of the heat-expandable microsphere in the heat-releasable pressure-sensitive adhesive layer to thereby reduce the pressure-sensitive adhesive strength, whereby the adherend subjected to processing can be isolated.

The heating treatment at the time of releasing or separating the double-sided pressure-sensitive adhesive tape or sheet from the adherend subjected to processing (processed article) can be carried out, for example, by using an appropriate heating device such as a hot plate, a hot air dryer, a near-infrared lamp, or an air dryer. The heating temperature has only to be equal to or higher than the thermal-expansion initiating temperature (foam initiating temperature) of the heat-expandable microsphere in the heat-releasable pressure-sensitive adhesive layer. The conditions for the heating treatment can be set as appropriate according to the surface condition of the adherend, the degree of reduction of the adhesion area depending on the kind of the heat-expandable microsphere and the like, the thermal stability of the substrate and the adherend, the kind of heating procedure (e.g., heat capacity and heating device), and the like. General conditions for the heating treatment are as follows: a temperature of 100 to 250° C., for 5 to 90 seconds (hot plate or the like) or for 5 to 15 minutes (hot air dryer or the like). By heating under these conditions, the heat-expandable microsphere in the heat-releasable pressure-sensitive adhesive layer generally expands and/or foams, whereby the heat-releasable pressure-sensitive adhesive layer expands and deforms to have an uneven surface, thereby lowering or losing adhesive strength. The heating treatment may be conducted in an appropriate stage according to the purpose. In addition, an infrared lamp or heated water may be used as a heat source in some cases.

In the present invention, a pedestal (supporting pedestal) to be affixed to the double-sided pressure-sensitive adhesive tape or sheet through the pressure-sensitive adhesive layer for temporary fixing is not particularly limited as far as it can support an adherend affixed to the heat-releasable pressure-sensitive adhesive layer. Any known or common pedestal for use in the processing of the adherend can be used. Specific examples of the pedestal include stainless steel plates, glass plates, and dummy wafers. The pedestal can be selected as appropriate according to the kind of the adherend and the method of processing the adherend.

[Adherend]

In the present invention, an article (adherend or article to be processed) to be affixed to and held by the double-sided pressure-sensitive adhesive tape or sheet can be arbitrarily selected. Specific examples of the adherend (article to be processed) include various articles including electronic components such as semiconductor wafers (silicon wafers etc.) and semiconductor chips; electric articles such as ceramic capacitors and oscillators; and display devices such as liquid crystal cells, and also include thermal heads, solar cells, printed circuit boards (multilayer ceramic sheets etc.), and so-called "green sheets". These adherends may be alone or two or more thereof may be combined.

[Processed Adherend; Processed Article]

Moreover, in the present invention, various processed articles can be obtained by affixing an article to be processed (material to be processed) as an adherend to a pedestal through the double-sided pressure-sensitive adhesive tape or sheet and carrying out processing. For example, electronic components, circuit boards, or the like can be obtained as processed articles in the case of using electronic components such as semiconductor wafers, as adherends (articles to be processed). Likewise, multilayer ceramic capacitors or the like can be obtained as processed articles in the case of using green sheets for ceramic capacitors as adherends. Namely, in the present invention, electronic components and multilayer ceramic capacitors are fabricated by using the double-sided pressure-sensitive adhesive tape or sheet and by the method of processing an adherend as mentioned above.

EXAMPLES

The following will describe the present invention in further detail with reference to Examples but the present invention should not be construed as being limited by these Examples.

Example 1

A toluene solution containing a pressure-sensing adhesive having a composition in which 2 parts by weight of an isocyanate crosslinking agent (track name "Coronate L", manufactured by Nippon Polyurethane Industry Co., Ltd.) was blended per 100 parts by weight of an acrylic copolymer (acrylic copolymer composed of 100 parts by weight of 2-ethylhexyl acrylate, 40 parts by weight of ethyl acrylate, 6 parts by weight of 2-hydroxyethyl acrylate, and 7 parts by weight of methyl methacrylate as monomer components) was prepared. The toluene solution was applied on one side of a polyester-made film (thickness: 100 μm) as a substrate so that the thickness after drying and curing was 10 μm and was heated and dried at 120° C. for 2 minutes to obtain a pressure-sensitive adhesive layer for temporary fixing.

Then, a toluene solution containing a pressure-sensing adhesive having a composition in which 2 parts by weight of an isocyanate crosslinking agent (trade name "Corollate L", manufactured by Nippon Polyurethane Industry Co., Ltd.) was blended per 100 parts by weight of an acrylic copolymer (acrylic copolymer composed of 100 parts by weight of 2-ethylhexyl acrylate, 40 parts by weight of ethyl acrylate, 6 parts by weight of methyl methacrylate, and 7 parts by weight of 2-hydroxyethyl acrylate as monomer components) was prepared. The toluene solution was applied on another side (opposite side of the side on which the pressure-sensitive adhesive layer for temporary fixing had been formed) of the polyester-made film (thickness: 100 μm) as a substrate so that the thickness after drying and curing was 15 μm and was heated and dried at 120° C. for 2 minutes to obtain a rubber-like organic elastic layer.

Subsequently, a toluene solution containing a heat-expandable microsphere-containing pressure-sensing adhesive having a composition in which 2 parts by weight of an isocyanate crosslinking agent (trade name "Coronate L", manufactured by Nippon Polyurethane Industry Co., Ltd.), 20 parts by weight of a terpene tackifier resin (trade name "YS Polystar T130", manufactured by Yasuhara Chemical Co., Ltd.), and 40 parts by weight of a heat-expandable microsphere (trade name "F50D", manufactured by Matsumoto Yushi-Seiyaku Co., Ltd.) were blended per 100 parts by weight of an acrylic copolymer (acrylic copolymer composed of 100 parts by weight of 2-ethylhexyl acrylate, 40 parts by weight of ethyl acrylate, 6 parts by weight of methyl methacrylate, and 7 parts by weight of 2-hydroxyethyl acrylate as monomer components) was prepared. The toluene solution was applied on a separator so that the thickness after drying and curing was 35 μm and was heated and dried at 70° C. for 3 minutes to obtain a heat-releasable pressure-sensitive adhesive layer. Thereafter, the heat-releasable pressure-sensitive adhesive layer was affixed to the rubber-like organic elastic layer to obtain a double-sided pressure-sensitive adhesive tape or sheet having a layer structure of "pressure-sensitive adhesive layer for temporary fixing/substrate/rubber-like organic elastic layer/heat-releasable pressure-sensitive adhesive layer" (heat-releasable double-sided pressure-sensitive adhesive sheet).

Comparative Example 1

A double-sided pressure-sensitive adhesive tape or sheet having a layer structure of "pressure-sensitive adhesive layer for temporary fixing/substrate/rubber-like organic elastic layer/heat-releasable pressure-sensitive adhesive layer" (heat-releasable double-sided pressure-sensitive adhesive sheet) was obtained in the same manner as in Example 1 except that a toluene solution containing a pressure-sensing adhesive having a composition in which 2 parts by weight of an isocyanate crosslinking agent (trade name "Coronate L", manufactured by Nippon Polyurethane Industry Co., Ltd.), 15 parts by weight of a polymerized rosin resin (trade name "HARIESTER KT-2", manufactured by Harima Chemicals, Inc.), and 5 parts by weight of a hydrogenated rosin resin (trade name "STAYBELITE E", manufactured by Eastman Chemical Company) were blended per 100 parts by weight of an acrylic copolymer (acrylic copolymer composed of 100 parts by weight of n-butyl acrylate and 5 parts by weight of acrylic acid as monomer components) was used as a toluene solution containing a pressure-sensing adhesive for forming the pressure-sensitive adhesive layer for temporary fixing.

Comparative Example 2

A double-sided pressure-sensitive adhesive tape or sheet having a layer structure of "pressure-sensitive adhesive layer for temporary fixing/substrate/rubber-like organic elastic layer/heat-releasable pressure-sensitive adhesive layer" (heat-releasable double-sided pressure-sensitive adhesive sheet) was obtained in the same manner as in Example 1 except that a toluene solution containing a pressure-sensing adhesive having a composition in which 2 parts by weight of an isocyanate crosslinking agent (trade name "Coronate L", manufactured by Nippon Polyurethane Industry Co, Ltd.) and 15 parts by weight of a plasticizer (trade name "Monocizer W-700", manufactured by Dainippon Ink And Chemicals, Incorporated; DOP) were blended per 100 parts by weight of an acrylic copolymer (acrylic copolymer composed of 100 parts by weight of 2-ethylhexyl acrylate, 40 parts by weight of ethyl acrylate, 6 parts by weight of 2-hydroxyethyl acrylate, and 7 parts by weight of methyl methacrylate as monomer components) was used as a toluene solution containing a pressure-sensing adhesive for forming the pressure-sensitive adhesive layer for temporary fixing.

(Evaluation)

The double-sided pressure-sensitive adhesive tapes or sheets obtained in Example 1 and Comparative Examples 1 and 2 were determined or evaluated on the tensile pressure-sensitive adhesive strength, the amount of displacement, X/Y ratio, the gel fraction, pedestal holding ability, and resistance to lateral displacement, according to the following measuring and evaluation methods.

(Method of Measuring Tensile Pressure-Sensitive Adhesive Strength)

Each of the double-sided pressure-sensitive adhesive tapes or sheets according to Example and Comparative Examples was cut into a size of 20 mm in width and 100 mm in length and it was affixed to an SUS 304BA plate under pressure by a method of allowing a 2-kg roller to move to and from thereon once under conditions of an ordinary temperature (23° C.±2° C.) and a humidity of 65±5% RH in such a form that the pressure-sensitive adhesive layer for temporary fixing was in contact with the SUS 304BA plate, followed by standing for 30 minutes. After standing, the load (maximum load) at the time when the double-sided pressure-sensitive adhesive tape or sheet was peeled off from the SUS 304BA plate under conditions of a peeling angle of 180° and a tensile speed of 300 mm/min was measured under conditions of a temperature of 232° C. and a humidity of 65±5% RH, thereby determining the tensile pressure-sensitive adhesive strength (N/20 mm in width).

(Method of Measuring Amount of Displacement)

Each of the double-sided pressure-sensitive adhesive tapes or sheets according to Example and Comparative Examples was cut into a size of 20 mm in width and 100 mm in length and, under conditions of an ordinary temperature (23° C.±2° C.) and a humidity of 65±5% RH, it was affixed to an SUS 304BA plate under pressure in an adhesion area of 20 mm in width×10 mm by a method of allowing a 2-kg roller to move to and from thereon once in such a form that the pressure-sensitive adhesive layer for temporary fixing was in contact with the SUS 304BA plate, followed by standing for 30 minutes at 23±2° C. After standing, a load of 200 g was applied to an end part of the double-sided pressure-sensitive adhesive tape or sheet and the degree of displacement (amount of displacement) from the time of the affixing under pressure was measured in accordance with the measuring method of holding power specified in JIS Z 0237 and thus the amount of displacement after 60 minutes at 23±2° C. (mm/20 mm in width) was determined.

(Method of Measuring Gel Fraction)

The pressure-sensitive adhesive composition for forming a pressure-sensitive adhesive layer for temporary fixing was applied on a release liner and then dried or cured to form a pressure-sensitive adhesive layer for temporary fixing. The pressure-sensitive adhesive layer for temporary fixing was weighed to determine its weight, and this weight was defined as a weight before immersion (A). Next, the pressure-sensitive adhesive layer for temporary fixing was immersed in toluene at ordinary temperature (23±2° C.) for 72 hours and then an unsolved portion was taken out from which toluene was completely evaporated using an oven or the like. The dried unsolved portion was weighed to determine its weight and this weight was defined as a weight after immersion (B).

A gel fraction was calculated according to the following Equation (1):

$$\text{Gel fraction (\% by weight)} = (B/A) \times 100 \qquad (1)$$

(In Equation (1), "A" represents the weight before immersion; and "B" represents the weight after immersion.

(Method of Evaluating Pedestal Holding Ability)

Figure 2:
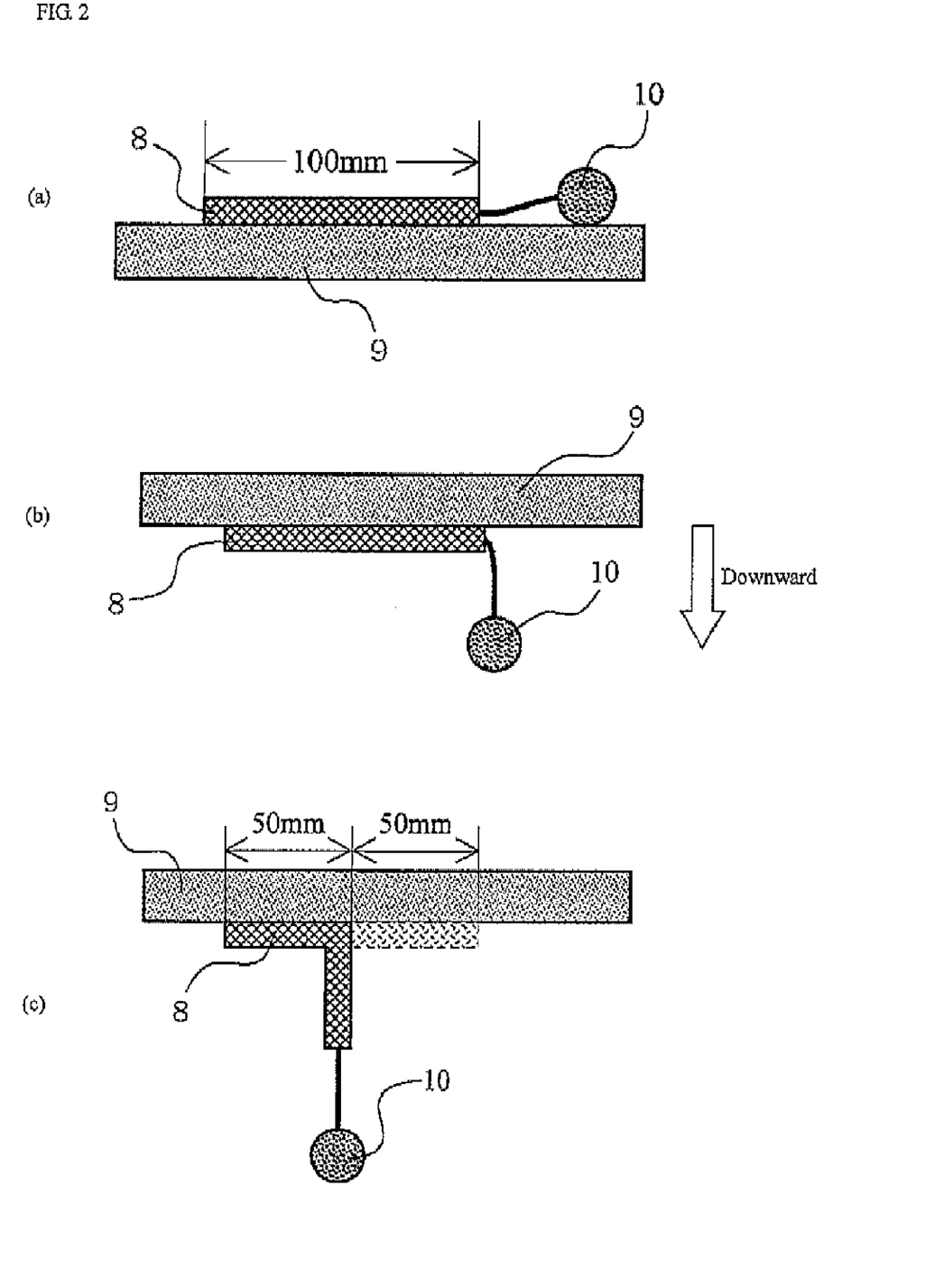

Each of the double-sided pressure-sensitive adhesive tapes or sheets according to Example and Comparative Examples was cut into a size of 20 mm in width and 100 mm in length to prepare a sample. The sample was affixed to an SUS 304BA plate in such a form that the pressure-sensitive adhesive layer for temporary fixing was in contact with the SUS 304BA plate, under pressure by a method of allowing a 2-kg roller to move to and from thereon once. Then, a weight of 50 g was attached to one end of the sample, as shown in FIG. 2-(a). This was placed so that the sample side (side of the double-sided pressure-sensitive adhesive tape or sheet) becomes downward, as shown in FIG. 2-(b), and the end of the sample (double-sided pressure-sensitive adhesive tape or sheet), to which the weight had been attached, was peeled by 50 mm, as shown in FIG. 2-(c). Thereafter, the weight was softly released and a peeled length (mm) after one minute was measured, based on the position at release being taken as the origin (zero). The pedestal holding ability was evaluated according to the following criteria.

Criteria of Pedestal Holding Ability:
  O: The peeled length is less than 10 mm.
  X: The peeled length is 10 mm or more.

Incidentally, FIG. 2-(a) to FIG. 2-(c) are schematic views showing a method of evaluating pedestal holding ability in Examples, FIG. 2-(a) is a schematic view showing a state that a weight of 50 g is attached to one end of a sample that has been affixed to an SUS 304BA plate, FIG. 2-(b) is a schematic view showing a state that the sample side is set to be downward, and FIG. 2-(c) is a schematic view showing a state that the end of the sample, to which the weight has been attached, is peeled by 50 mm. In FIG. 2-(a) to FIG. 2-(c), the numeral 8 is a sample (double-sided pressure-sensitive adhesive tape or sheet), the numeral 9 is an SUS 304 BA plate (stainless steel plate), and the numeral 10 is a weight of 50 g.

(Method of Evaluating Resistance to Lateral Displacement)

Each of the double-sided pressure-sensitive adhesive tapes or sheets according to Example and Comparative Examples was cut into a size of 10 mm in width and 100 mm in length to prepare a sample. The sample was affixed to an SUS 304BA plate in an adhesion area of 10 mm in width 20 mm in length in such a form that the pressure sensitive adhesive layer for temporary fixing was in contact with the SUS 304BA plate, under pressure by a method of allowing a 2-kg roller to move to and from thereon once. Then, a load of 5 N was placed on the affixed portion under an atmosphere of 40±2° C., and, in addition, a load of 5 N force in a shear direction was applied to an end of the double-sided pressure-sensitive adhesive tape or sheet not affixed to the SUS 304BA plate. After keeping this condition for one hour, the displacement (mm) of the double-sided pressure-sensitive adhesive tape or sheet was measured. The resistance to lateral displacement was evaluated according to the following evaluation criteria.

Evaluation Criteria of Resistance to Lateral Displacement:

O: The displacement is less than 0.3 mm.

X: The displacement is 0.3 mm or more.

TABLE 1

|  | Example 1 | Comparative Example 1 | Comparative Example 2 |
| --- | --- | --- | --- |
| Tensile pressure-sensitive adhesive strength (N/20 mm) | 3.2 | 8.7 | 0.7 |
| Amount of displacement (mm/20 mm) | 0.1 | 0.4 | 0.1 |
| Gel fraction (% by weight) | 77 | 32 | 61 |
| Pedestal holding ability | O | O | X |
| Resistance to lateral displacement | O | X | O |

As is shown in Table 1, it was confirmed that the double-sided pressure-sensitive adhesive tape or sheet according to Example 1 had excellent pedestal holding ability and can effectively suppress or prevent lateral displacement since the pressure-sensitive adhesive layer for temporary fixing had a characteristic that the tensile pressure-sensitive adhesive strength was 2.0 to 20 N/20 mm in width and also a characteristic that the amount of displacement was 0.3 mm/20 mm in width or less.

While the present invention has been described in detail and with reference to specific embodiments thereof, it will be apparent to one skilled in the art that various changes and modifications can be made therein without departing from the spirit and scope thereof. The present application is based on Japanese Patent Application (No. 2011-009255) filed on Jan. 19, 2011, and the contents are incorporated herein by reference.

DESCRIPTION OF REFERENCE NUMERALS AND SIGNS

1: Double-sided pressure-sensitive adhesive tape or sheet
2: Substrate
3: Rubber-like organic elastic layer
4: Heat-releasable pressure-sensitive adhesive layer
5: Pressure-sensitive adhesive layer for temporary fixing
6: Separator
7: Separator
8: Sample
9: SUS 304BA plate
10: Weight of 50 g

The invention claimed is:

1. A double-sided pressure-sensitive adhesive tape or sheet, comprising
a heat-releasable pressure-sensitive adhesive layer containing a heat-expandable microsphere on one side of a substrate, and
a pressure-sensitive adhesive layer for temporary fixing free from heat-expandable microspheres on another side of the substrate,
wherein the pressure-sensitive adhesive layer for temporary fixing has a tensile pressure-sensitive adhesive strength of 2.0 to 20 N/20 mm in width and an amount of displacement of 0.3 mm/20 mm in width or less, and the pressure-sensitive adhesive layer for temporary fixing is crosslinked with an isocyanate or epoxy crosslinking agent.

2. The double-sided pressure-sensitive adhesive tape or sheet according to claim 1, wherein the pressure-sensitive adhesive layer for temporary fixing has a characteristic that a gel fraction is 50% by weight or more.

3. A method of processing an adherend by using a double-sided pressure-sensitive adhesive tape or sheet, the method comprising the steps of: fixing the double-sided pressure-sensitive adhesive tape or sheet according to claim 1 to a pedestal through the pressure-sensitive adhesive layer for temporary fixing; and carrying out processing of the adherend in such a state that the adhered is affixed on the heat-releasable pressure-sensitive adhesive layer.

4. The method of processing an adherend according to claim 3, wherein the adherend is an electronic component.

5. The method of processing an adherend according to claim 3, wherein the adherend is a green sheet for a ceramic capacitor and the method further comprises a step of laminating green sheets.

6. An electronic component fabricated by the method of processing an adherend according to claim 4.

7. A multilayer ceramic capacitor fabricated by the method of processing an adherend according to claim 5.

* * * * *